US009250815B2

(12) United States Patent
Hunter et al.

(10) Patent No.: US 9,250,815 B2
(45) Date of Patent: Feb. 2, 2016

(54) DRAM CONTROLLER FOR VARIABLE REFRESH OPERATION TIMING

(71) Applicant: International Business Machines Corporation, Armonk, NY (US)

(72) Inventors: Hillery C. Hunter, Chappaqua, NY (US); Kyu-hyoun Kim, Chappaqua, NY (US); Janani Mukundan, Ithaca, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/823,094

(22) Filed: Aug. 11, 2015

(65) Prior Publication Data

US 2015/0347036 A1    Dec. 3, 2015

Related U.S. Application Data

(63) Continuation of application No. 13/827,691, filed on Mar. 14, 2013.

(51) Int. Cl.
*G11C 11/406*     (2006.01)
*G06F 13/16*      (2006.01)
*G06F 3/06*       (2006.01)
*G11C 11/4076*    (2006.01)

(52) U.S. Cl.
CPC ............ *G06F 3/0613* (2013.01); *G06F 3/0653* (2013.01); *G06F 3/0659* (2013.01); *G06F 3/0673* (2013.01); *G11C 11/4076* (2013.01); *G11C 11/40607* (2013.01)

(58) Field of Classification Search
None
See application file for complete search history.

(56) References Cited

U.S. PATENT DOCUMENTS

| 4,980,852 | A  | 12/1990 | Giroir et al. |
| 5,355,518 | A  | 10/1994 | Kindinger et al. |
| 5,530,933 | A  | 6/1996  | Frink et al. |
| 6,819,598 | B2 | 11/2004 | Yamazaki et al. |
| 7,305,518 | B2 | 12/2007 | Zeighami et al. |
| 8,130,585 | B2 | 3/2012  | Schreck et al. |

(Continued)

OTHER PUBLICATIONS

Anonymous, "DDR4 SDRAM Standard", JEDEC Standard No. 79-4, Sep. 2012, pp. 1-103. © JEDEC Solid State Technology Association, U.S.A.

(Continued)

*Primary Examiner* — Jared Rutz
*Assistant Examiner* — William E Baughman
(74) *Attorney, Agent, or Firm* — Penny L. Lowry; Robert Williams (57) ABSTRACT

A method for selection of a DRAM refresh timing in a DRAM memory system is disclosed. The method may include running a workload for a first number of refresh intervals using a first DRAM refresh timing and making a first workload throughput measurement for the first number of refresh intervals. The method may also include running the workload for a second number of refresh intervals using a second DRAM refresh timing and making a second workload throughput measurement for the second number of refresh intervals. The method may further include deciding if the first throughput measurement is greater than the second throughput measurement, and then selecting the first DRAM refresh timing as a selected DRAM refresh timing, or deciding if the second throughput measurement is greater than the first throughput measurement, then selecting the second DRAM refresh timing as the selected DRAM refresh timing.

11 Claims, 5 Drawing Sheets

(56) References Cited

U.S. PATENT DOCUMENTS

| | | |
|---|---|---|
| 8,180,964 B1 | 5/2012 | Koh et al. |
| 8,244,972 B2 | 8/2012 | Bronson et al. |
| 2001/0009022 A1 | 7/2001 | Feierbach |
| 2004/0123008 A1 | 6/2004 | Connor et al. |
| 2009/0144506 A1 | 6/2009 | Barth, Jr. et al. |
| 2011/0071779 A1 | 3/2011 | Kim |
| 2011/0320696 A1 | 12/2011 | Fee et al. |
| 2012/0134224 A1 | 5/2012 | Shim et al. |
| 2012/0221916 A1 | 8/2012 | Schreck et al. |
| 2012/0300564 A1 | 11/2012 | Dreps et al. |
| 2014/0281202 A1 | 9/2014 | Hunter et al. |

OTHER PUBLICATIONS

IBM TBD, "Refresh Algorithm", IP.com Prior Art Database. IP.com No. IPCOM000050261D, Original Publication Date Sep. 1, 1982. Original Disclosure Information TBD 09-82 p. 2217, IP.com Electronic Publication Feb. 10, 2005. © IP.com, Inc.

100 DRAM
Refresh Timing

FIG. 1A

150 DRAM Refresh
vs Max. Read Delay

DRAM CONTROLLER FOR VARIABLE REFRESH OPERATION TIMING

TECHNICAL FIELD

The present disclosure relates to DRAM memory controllers. In particular, this disclosure relates to variable refresh timing to improve effective workload throughput.

BACKGROUND

The well known and characterized nature of DRAM memory cells to leak charge used to represent stored logic values requires the cells to be regularly and periodically refreshed (read and re-written). If the cells are not refreshed before the charge level diminishes significantly, data loss may result. During the time consumed by a DRAM refresh operation, the portion of the memory (DIMM, chip, or rank) being refreshed becomes unavailable for normal read and write operations, rendering it unusable during that period of time.

A convergence of ongoing trends in DRAM design and usage have caused an increase in the total amount of time required for refresh, relative to the total amount of time the memory is available for read/write operations. These trends include increased memory capacity per system, increased memory density per chip, the need to limit chip power supply noise, higher leakage rates in shrinking chip technologies, and shorter refresh intervals.

Because processor access to data contained in DRAM memory is a critical factor in overall computer system performance, workload and application throughput can be limited by the decreasing fraction of time that DRAM memory is available for read and write operations. The introduction of DDR4 memory devices included a number of options to change both DRAM refresh interval timing, as well as the amount of time taken for each refresh operation. These options may be selected at any point in time, for example on system boot-up. However, a fixed DRAM refresh setting may not yield appropriate or suitable memory system throughput characteristics for a workload which may change over time.

SUMMARY

One embodiment is directed to a method for selection of a DRAM refresh timing in a DRAM memory system. The method may include running a workload for a first number of refresh intervals using a first DRAM refresh timing and making a first workload throughput measurement for the first number of refresh intervals. The method may also include running the workload for a second number of refresh intervals using a second DRAM refresh timing and making a second workload throughput measurement for the second number of refresh intervals. The method may further include deciding if the first throughput measurement is greater than the second throughput measurement, and then selecting the first DRAM refresh timing as a selected DRAM refresh timing, or deciding if the second throughput measurement is greater than the first throughput measurement, then selecting the second DRAM refresh timing as the selected DRAM refresh timing.

Another embodiment is directed to a memory controller adapted to vary DRAM refresh timing. The memory controller may include a refresh mode controller to control DRAM refresh timing, and a memory performance measurement unit adapted to measure workload throughput. The refresh mode controller may monitor a workload throughput using a first DRAM refresh timing, and workload throughput using a second DRAM refresh timing, and may select the DRAM refresh timing of the greater workload throughput.

A further embodiment is directed to a method for selection of a DRAM refresh timing in a DRAM memory system. The method may include determining and setting a first DRAM refresh timing from hardware characteristic, and choosing to dynamically adjust or not dynamically adjust the DRAM refresh timing.

If dynamic refresh timing adjustment is chosen, the method may also include running a workload for a first number of refresh intervals using a first DRAM refresh timing and making a first workload throughput measurement for the first number of refresh intervals. The method may also include running the workload for a second number of refresh intervals using a second DRAM refresh timing and making a second workload throughput measurement for the second number of refresh intervals. The method may further include deciding if the first throughput measurement is greater than the second throughput measurement, and then selecting the first DRAM refresh timing as a selected DRAM refresh timing, or deciding if the second throughput measurement is greater than the first throughput measurement, then selecting the second DRAM refresh timing as the selected DRAM refresh timing.

Aspects of the various embodiments may provide increased throughput while running a workload.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

In the drawings and the Detailed Description, like numbers generally refer to like components, parts, steps, and processes.

DETAILED DESCRIPTION

In general, the embodiments describe a memory controller and a method for dynamically adjusting DRAM refresh timing, according to workload performance measurements. A computer system according to the invention may have increased workload throughput while running a workload.

The density and cost-effectiveness of DRAM memory devices have caused them to be widely employed in many computer and electronic systems. It is well understood that DRAM memory cells, in storing charge representing binary data, have a finite data (charge) retention time (tRET) due to charge leakage. In order to maintain data in the DRAM cells beyond the charge retention time (tRET), the cells require periodic refresh (reading and re-writing of data).

The time required to refresh the DRAM device is known as lockout, due to the fact that during a refresh operation, the DRAM device is locked out (unavailable) for application read and write operations. Lockout time reduces the time that the DRAM device is available for read and write operations. Lockout time for a single refresh operation is know as unit lockout, and cumulative lockout time over the DRAM cells retention period (tRET) is known as total lockout time. Refresh commands may involve all the chips in a particular DRAM rank, making them inaccessible for read/write access during a refresh operation.

As DRAM memory technology has advanced, a number of individual factors have contributed to an increase in the portion of time required for DRAM refresh operations. These factors include higher density DRAM chips and systems, resulting electrical noise issues, smaller geometry memory cells with higher leakage and lower charge capacity, and lower data retention times (tRET). The effect of increased time required for refresh operations may be a decrease in workload throughput, due to the DRAM devices being less available for read and write operations. Memory throughput may be a critical factor in overall computer system throughput.

DRAM technologies prior to DDR4 offered a single (1×) fixed refresh timing option. The introduction of DDR4 memory technology has added the ability to dynamically switch between three available refresh timing options; 1×, 2×, and 4× (described in greater detail in relation to FIGS. 1A & 1B). More than three timing options are contemplated, and may become available in future DRAM memory technologies.

Processors in modern computer systems are often running (multi-tasking) a number of applications and other processes. For the purposes of discussion, a workload will be defined as any combination of one or more software applications and foreground or background processes that may be concurrently run on a processor or group of processors acting in a coherent manner.

Workloads (including applications and other processes) may exhibit what is termed phase behavior. During various time periods of a workload or application, workload throughput demands may vary, according to what phase the workload is in. For example, when an application first starts running, it may enter a phase of loading a large amount of data from a disk drive into memory. The application may then enter a phase of relatively few memory accesses as it waits for user input, followed by various phases of memory activity bursts, followed finally by a phase involving a large transfer of data from memory back to disk as the application terminates. During the various phases, the memory throughput demands may vary widely as may the ratio of memory read to write commands.

Also for the purposes of discussion, memory will be defined as any arrangement of DRAM devices, which may be organized by chip, DIMM, channel, rank, or other means, and accessible through a memory controller device. Memory commands may include read, write, or refresh operations.

For the purposes of discussion, DRAM refresh timing includes two parameters that may be varied by selecting one of 1×, 2×, or 4× refresh timing modes; refresh interval (tREFi) and refresh operation time (tRFC). It is important to note that tRFC is the unit refresh time; the refresh time for one individual refresh command to be executed, and includes both the actual time for the refresh operation, as well as a finite overhead time to initiate the refresh command. tRFC may also be called unit lockout time. The refresh interval (tREFi) is the length of the time period between the start of two adjacent refresh commands. For each of 1×, 2×, or 4× refresh timing modes, tREFi and tRFC have fixed, interrelated values. Examples of these parameters are discussed in reference to FIG. 1A, 1B.

Additional related DRAM refresh timing parameters include per cell data retention time (tRET) and the number of refresh commands issues per chip (Nref) within the retention time (tRET) by a memory controller. Every DRAM memory cell must be periodically refreshed within one tRET time, otherwise the data in that cell may be lost.

Memory parallelism is a term that refers to the number of parallel paths that may be used to access (read, write, or refresh) the contents of a memory structure. A memory structure or device with a high degree of parallelism has multiple paths that may be used to access its contents. Paths may be associated with independent ranks, memory chips, or access channels from a controller(s). Conversely, memory with low parallelism may have few or only one access path. An access path may include busses for commands and data flow into and out of the memory.

Memory architectures that have less parallelism generally yield workload throughput improvements when shorter refresh intervals (e.g.; 4×) are implemented, and memory architectures that have greater parallelism generally yield workload throughput improvements when longer refresh intervals (e.g.; 1×) are implemented.

The introduction of adjustable refresh timing was intended to minimize average wait time for a read operation which arrives at a memory controller while refresh is in progress.

However DRAM refresh timing settings that are fixed may not yield suitable memory throughput for a workload with changing memory access demands.

Figure 1A:
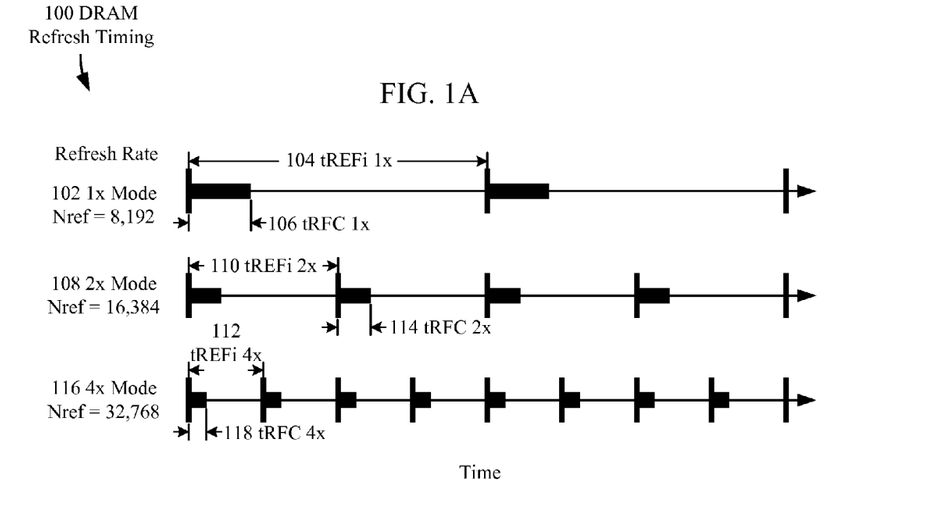
FIG. 1A is a DRAM refresh timing diagram depicting 1×, 2×, and 4× refresh timings, according to embodiments of the invention.
Figure 1B:
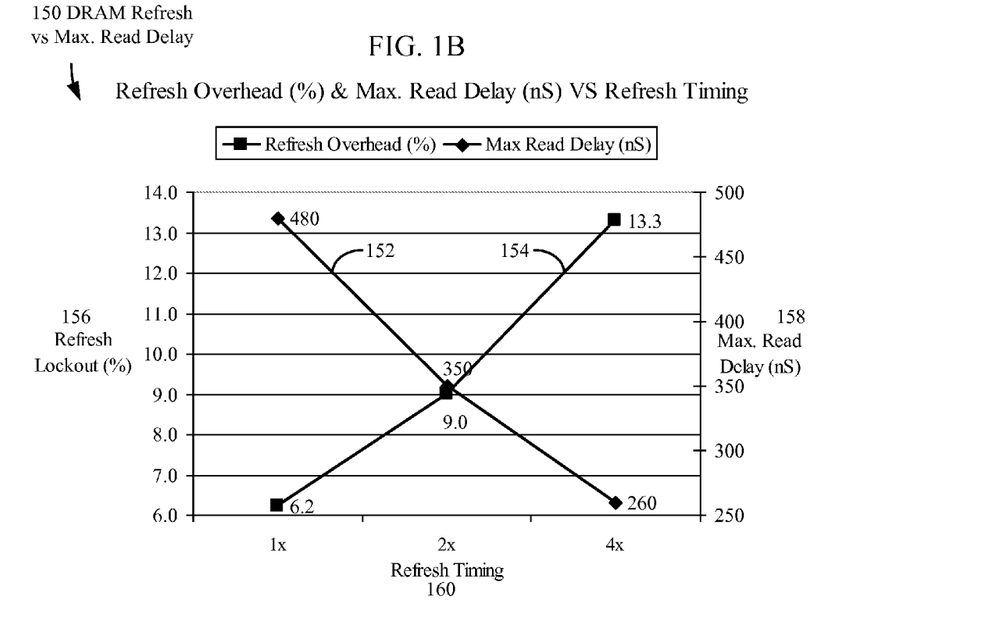
FIG. 1B is a graph of refresh overhead and maximum read delay plotted for 1×, 2× and 4× refresh timings, according to embodiments of the invention.

Embodiments of the invention make use of the ability to dynamically switch between multiple refresh timing options during workload run time, in order to adapt DRAM refresh timing to specific workload conditions, which may yield increased workload throughput. FIGS. 1A and 1B depict exemplary DRAM refresh timing characteristics, and illustrate the differences found between 1×, 2×, and 4× operation modes.

FIG. 1A is a DRAM refresh timing diagram depicting 1×, 2×, and 4× refresh timing characteristics, according to embodiments of the invention. Each of 1× Mode 102, 2× Mode 108 and 4× Mode 116 illustrate a regular periodic refresh operation's frequency and duration relationships over time.

1× Mode 102 illustrates the slowest (least frequent) refresh mode available for DDR4 memory technologies. This mode also depicts timing available in memory technologies available prior to DDR4, such as DDR, DDR2, and DDR3. The 2× Mode 108 and 4× Mode 116 were newly introduced in DDR4 technology, and were not available in prior DDR technologies.

1× Mode 102 has a refresh interval tREFi 1× 104, and a refresh operation time (lockout period) tRFC 1× 106. While operating in 1× Mode 102, a DRAM receives regular refresh commands at a repeating time interval of tREFi 1× 104. Each refresh command initiates the refresh of a group of DRAM memory cells. During the tRFC 1× 106, a refresh operation takes place on particular memory ranks, prohibiting any read or write commands to be executed on the affected ranks until the completion of the tRFC 1× 106. The cycle comprised of tREFi 1× 104 and tRFC 1× 106 regularly repeats until the refresh mode changes, or the memory system is disabled.

Each refresh operation time tRFC 1× 106 includes time for refresh operations on the DRAM, as well as additional time (overhead) required to initiate the refresh operation. For an exemplary DDR4 DRAM operated in 1× Mode 102, a total of 8,192 refresh operations may be completed within one DRAM cell retention time (tRET). A small portion of the cells of the DRAM chips are refreshed during each refresh operation.

2× Mode 108 has a refresh interval tREFi 2× 110, and a refresh operation time (lockout period) tRFC 2× 114. The refresh interval tREFi 2× 110 is ½ the duration of tREFi 1× 104, and tRFC 2× 114 is approximately ½ of the duration of tRFC 1× 106. Similarly to 1× Mode 102, while in 2× Mode 108 a DRAM receives regular refresh commands at the repeating time interval tREFi 2× 110, refreshes particular ranks during the tRFC 2× 114, prohibiting read and write operations until the refresh is complete. The refresh cycle regularly repeats until the refresh mode changes, or the memory system is disabled. Each refresh operation tRFC 2× 114 has ½ the time allocated for refresh operations as tRFC 1× 106, and also includes overhead time required to initiate the refresh operation. For an exemplary DDR4 DRAM operated in 2× Mode 108, a total of 16,384 refresh operations may be completed within one DRAM cell retention time (tRET).

4× Mode 116 has a refresh interval tREFi 4× 112, and a refresh operation time (lockout period) tRFC 4× 118. The refresh interval tREFi 4× 112 is ¼ the duration of tREFi 1× 104, and tRFC 4× 118 is approximately ¼ of the duration of tRFC 1× 106. Similarly to 1× Mode 102, while in 4× Mode 116 a DRAM also receives regular refresh commands at the repeating time interval tREFi 4× 112, refreshes particular ranks during the tRFC 4× 118, prohibiting read and write operations until the refresh is complete. The refresh cycle regularly repeats until the refresh mode changes, or the memory system is disabled.

Each refresh operation tRFC 4× 118 has ¼ the time allocated for refresh operations as tRFC 1× 106, and also includes overhead time required to initiate the refresh operation. For an exemplary DDR4 DRAM operated in 4× Mode 116, a total of 32,768 refresh operations may be completed within one DRAM cell retention time (tRET).

The overhead required for initiating a refresh command is typically a fixed amount of time, regardless of which mode (1×, 2×, or 4×) the DRAM is operating in. Accordingly, the total amount of command initiation overhead is proportional to the number of refresh commands (Nref) issued within a given tRET time period. A DRAM operating in 2× refresh mode, therefore, will require twice the refresh command initiation overhead as when it runs in 1× refresh mode.

The lockout period for each refresh mode is comprised of the actual time allocated for refresh operations, plus command initiation overhead for initiating the refresh operations. The effect of running a DRAM in a 2× or 4× refresh mode may be more available time intervals for read and write operations, and smaller, but more frequent lockout times periods. The resulting shorter tRFC, may allow pending read and write commands be completed more quickly, i.e., lower average latency, by avoiding long wait times during relatively long tRFC 106 times.

FIG. 1B is a graph of exemplary refresh lockout (%) and maximum read delay (nS) plotted for 1×, 2×, and 4× refresh timings, according to embodiments of the invention. Curve 152 depicts a trend of decreasing maximum read delay (nS) as refresh timing progresses from 1× to 2× to 4× modes. Curve 154 depicts a trend of increasing refresh lockout (%) as refresh timing progresses from 1× to 2× to 4× modes.

The increasing percent of time consumed by DRAM refresh operations as the refresh mode progresses from 1× to 2× to 4×, indicated by curve 154 includes the cumulative effect of an increased number of refresh command initiation times for 2× and 4× refresh modes. While the actual time consumed by refresh operations in 1×, 2×, and 4× modes is identical, the added command initiation time for 2× and 4× mode refresh operations causes the percent of time consumed in lockout periods (refresh time added to command initiation time) to increase, as the number of individual refresh operations increases. An increasing percentage of time used in lockout periods results in a decreasing percentage of time that the DRAM is available to process read and write commands, and thus perform useful transactions.

The decreasing maximum read delay (nS) as refresh timing mode progresses from 1× to 2× to 4×, indicated by curve 152 includes tRFC 2× 114 and tRFC 4× 118, offset by the duration of a refresh command initiation time. The result of a smaller tRFC than tRFC 1× 106, is that memory latency for read and write operations is shortened compared to tRFC 1× 106, allowing read and write transactions to complete more quickly.

The DRAM Refresh vs. Max. Read Delay 150 therefore illustrates the tradeoffs of refresh lockout (%) vs. maximum read delay (nS). 1× refresh timing yields relatively long maximum read delay but low refresh lockout, while 4× refresh timing yields relatively short maximum read delay but higher refresh lockout. 2× refresh timing yields intermediate values of both refresh timing and maximum read delay.

Figure 2:
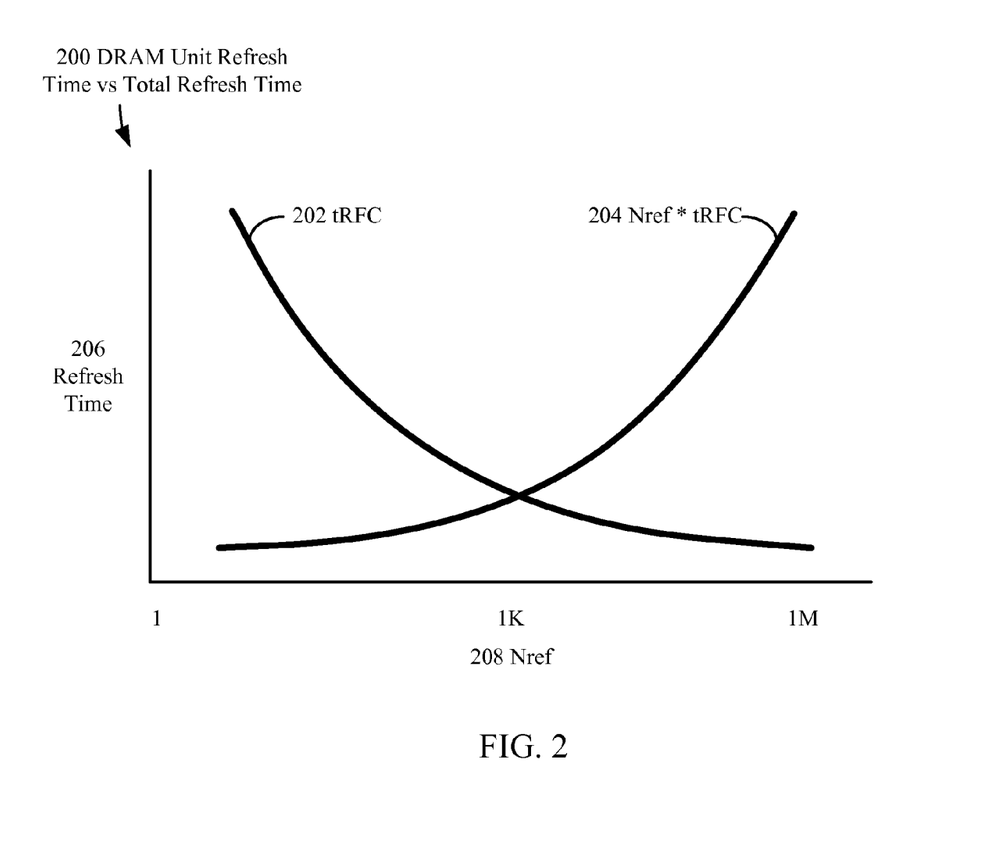
FIG. 2 is a graph of DRAM refresh operation time and cumulative DRAM refresh time plotted against the number of refresh operations per DRAM cell retention time, according to embodiments of the invention.

FIG. 2 is a graph of DRAM refresh unit lockout time tRFC 202 and cumulative DRAM refresh time Nref*tRFC 204 per tRET period plotted against the number of refresh operations Nref per DRAM cell retention time (tRET), according to embodiments of the invention.

As the number of refresh operations Nref per DRAM cell retention time (tRET) increases, DRAM refresh operation time tRFC 202 decreases asymptotically to a minimum value. Simultaneously, the cumulative DRAM refresh time Nref*tRFC 204 in tRET period increases exponentially from a minimum value, due to the overhead of refresh command initiation. Both the tRFC 202 and Nref*tRFC 204 curve shapes are influenced by refresh command initiation time. At large values of Nref, the refresh command initiation time multiplied by the number of refreshes (Nref) may become the largest part of Nref*tRFC 204. Both unit lockout time (tRFC) and total lockout time Nref*tRFC 204 parameters, may affect workload performance. High unit lockout time (tRFC) may cause delay in executing read and write commands. A high value of Nref*tRFC 204 may cause the DRAM to be less available due to excess lockout time.

FIG. 2 illustrates a performance tradeoff between average read delay, and total DRAM lockout time for refresh. Different workloads and benchmark suites have different memory usage patterns, and may yield improved throughput results at different points on the tradeoff curves; ie; using a different value of Nref.

Figure 3A:
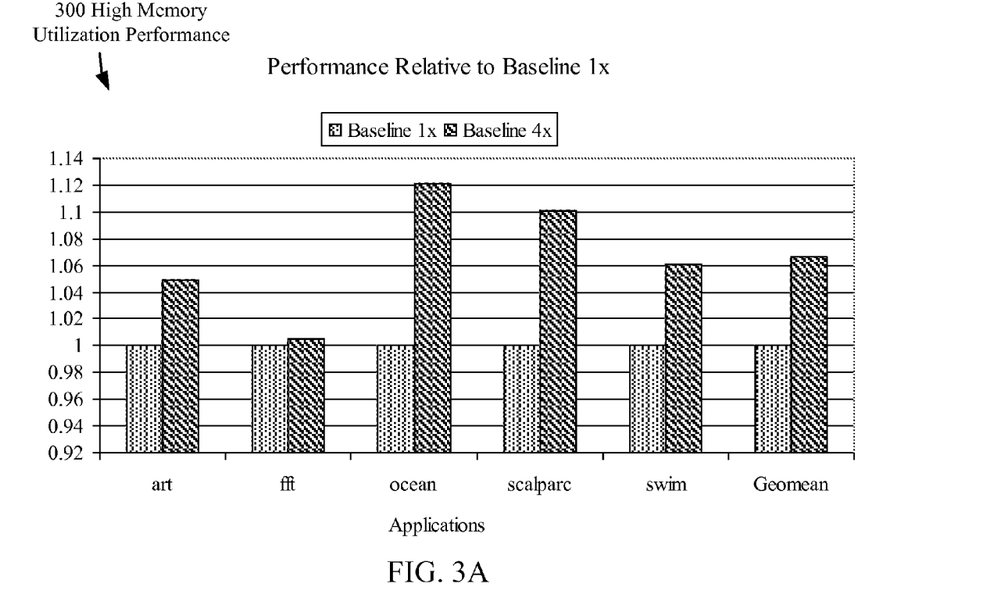
FIG. 3A is a graph depicting memory throughput of six high memory utilization applications run using 1× and 4×DRAM refresh timings, according to embodiments of the invention.
Figure 3B:
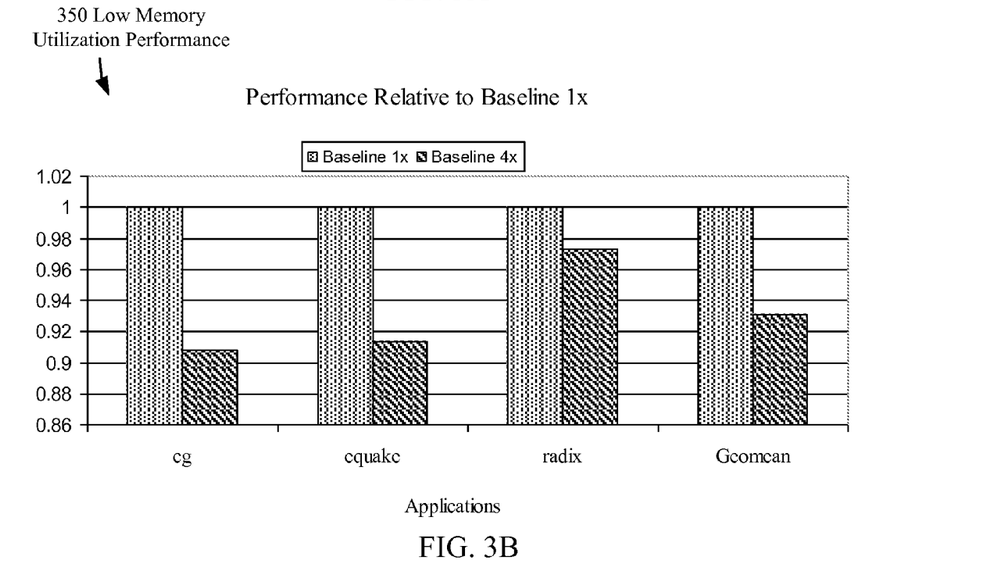
FIG. 3B is a graph depicting memory throughput of four low memory utilization applications run using 1× and 4×DRAM refresh timings, according to embodiments of the invention.

FIGS. 3A and 3B are graphs depicting exemplary relative memory throughput of applications run under 1× and 4× DRAM memory refresh settings. The performance measurements shown are relative, and were collected running applications on a platform that included software to emulate and record the effects of various DRAM refresh timings. Both FIGS. 3A and 3B show performance results using 1×DRAM refresh timings as a baseline for comparison to 4×DRAM refresh timings.

FIG. 3A is a graph depicting memory throughput of six high memory utilization applications run using 1× and 4×DRAM refresh timings, according to embodiments of the invention. High memory utilization applications typically make relatively frequent memory requests, and can be slowed or stalled due to inadequate data throughput. Insufficient memory throughput may result in a stalled memory transaction queue, delayed access to a particular DRAM rank, or a stalled processor waiting for data. High memory utilization applications are best served by a DRAM refresh timing that provides low latency, more frequent refresh. FIG. 3A shows up to a 12% increase in performance for 4× refresh timing (more frequent than 1× refresh timing) over a range of applications.

FIG. 3B is a graph depicting memory throughput of four low memory utilization applications run using 1× and 4×DRAM refresh timings, according to embodiments of the invention. Low memory utilization applications typically make relatively infrequent memory requests, with possibly larger amounts of data required per request than a high memory utilization application. Low memory utilization applications are best served by a DRAM refresh timing that provides longer latency refresh commands, and infrequent refreshes.

Insufficient access to memory for period of time (refreshes too frequently) may result in an increase in average delay in fulfilling pending memory read and write requests.

FIG. 3B shows up to a 9% increase in performance for 1× refresh timing (less frequent than 4× refresh timing) over a range of applications. FIGS. 3A and 3B illustrate that applications with certain types of memory throughput needs and characteristic memory access patterns may experience increased throughput from specific, tailored DRAM refresh controller timings.

Figure 4:
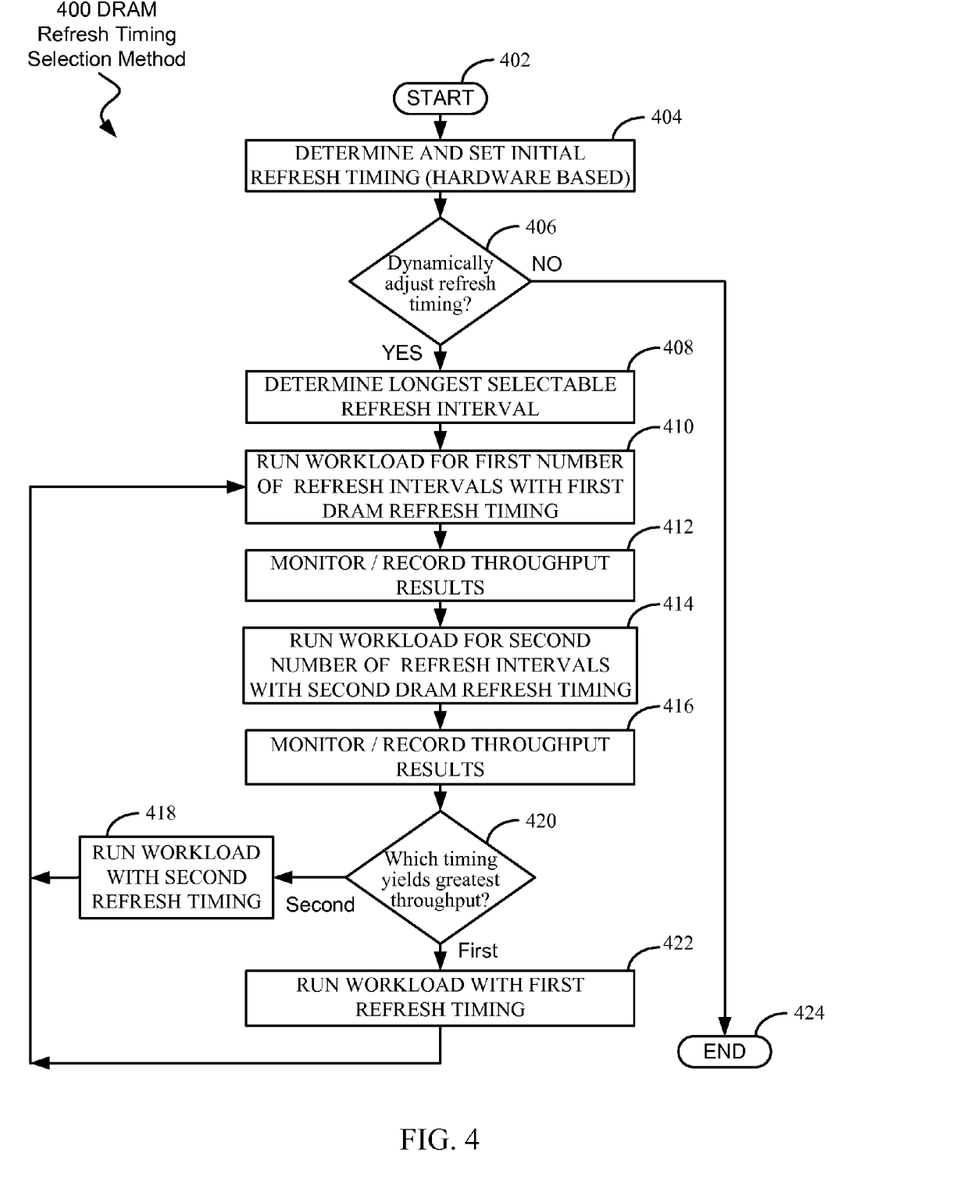
FIG. 4 is a flow diagram of an exemplary process for running a workload, monitoring, recording, and comparing throughput results in order to determine, set, and adjust DRAM refresh timing to run a workload with increased throughput, according to embodiments of the invention.

FIG. 4 depicts a flow chart of an exemplary process for determining and setting initial refresh timing, running a workload, monitoring, recording, and comparing throughput results in order to determine, set, and adjust DRAM refresh timing to run a workload with increased throughput, according to embodiments of the invention.

The process 400 moves from start 402 to determine and set initial refresh timing 404. At operation 404 the initial hardware configuration may be evaluated through firmware at boot time. The initial hardware configuration may include the number of memory DIMMs installed, the number of memory ranks and available channels, total memory capacity, and memory density. The firmware may use initial hardware configuration data as input to a lookup table or algorithm, and set the initial DRAM refresh timing mode. The output from the lookup table or algorithm may be a measure of parallelism of the available memory, and is used as the decision criteria. A processor and memory controller may also negotiate the initial DRAM refresh timing at boot time.

The process 400 moves to decision 406. At step 406, a decision is made between implementing and not implementing dynamic DRAM refresh timing adjustment. Firmware or software may use criteria such as the number of memory DIMMs installed, the number of memory ranks and available channels, total memory capacity, and memory density as input to a lookup table or algorithm. The output from the lookup table or algorithm may be a measure of parallelism of the available memory, and is used as the decision criteria. If the decision is not to implement dynamic DRAM refresh timing adjustment, the process may end at block 424. If the decision is to implement dynamic DRAM refresh timing adjustment, the process moves to determine longest selectable refresh interval 408. At step 408 the longest selectable refresh interval is selected, which may be determined from DRAM manufacturer's specifications, or possible hardcoded into the DRAM controller hardware. The processes 400 moves to step 410. At step 410, a workload is run for a first number of refresh intervals (tREFi) using the selected refresh timing. The workload may be a synthetic benchmark suite, or a combination of one or more applications and processes.

Figure 5:
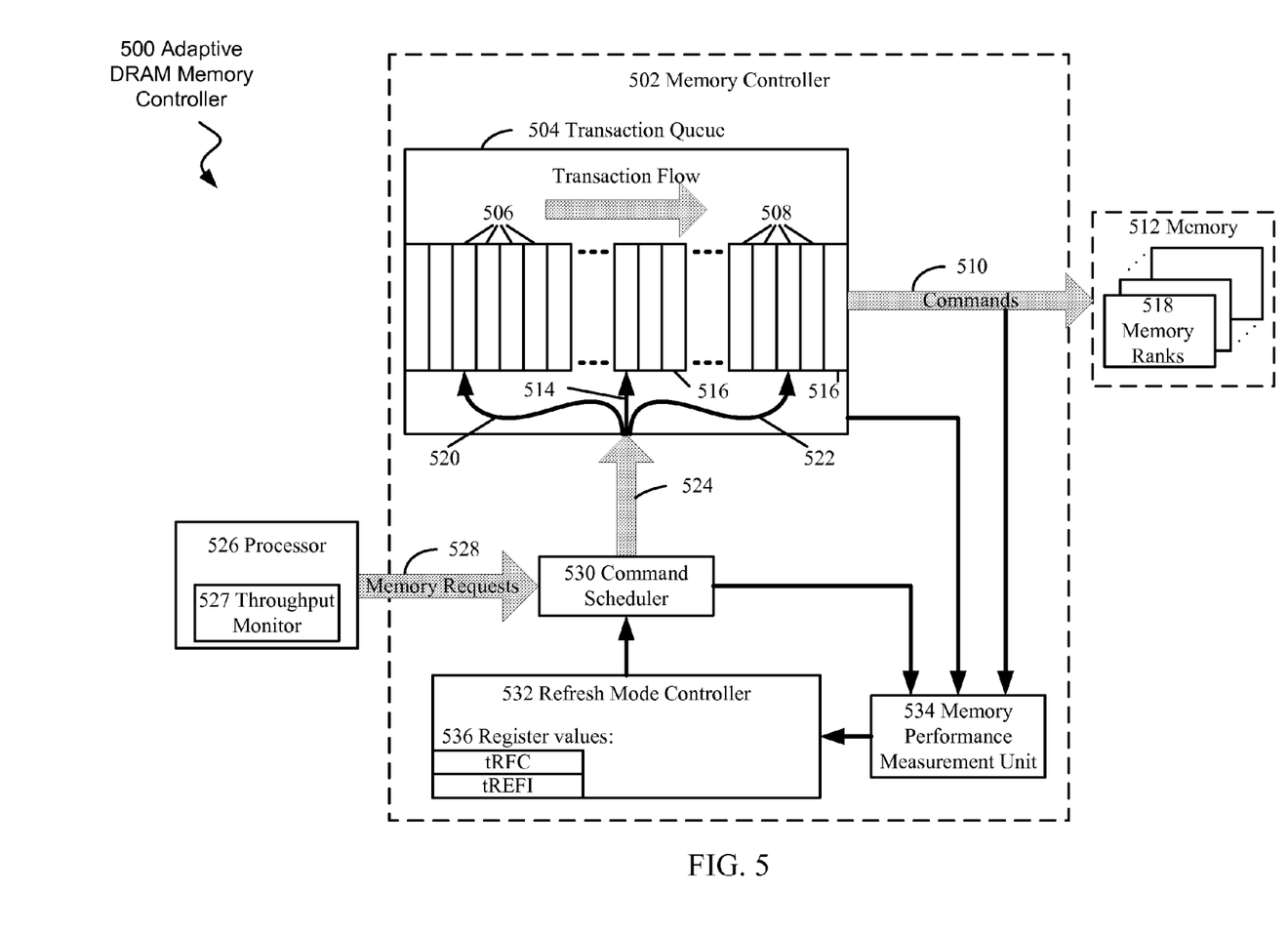
FIG. 5 is a block diagram representation of a memory controller according to embodiments of the invention.

The process moves to step 412, where the workload throughput results are monitored and recorded. Monitoring may include counting memory transactions on memory bus 510, receiving throughput information from a processor, monitoring the status of transaction queue 504, a command scheduler 530, or a cache. Throughput may be recorded in the memory controller 502.

The process moves to step 414, where a workload is run for a second number of refresh intervals (tREFi) using the second refresh timing, different than the first refresh timing used in step 410. The workload may be a synthetic benchmark suite, or a combination of one or more applications and processes. The process moves to step 416, where the workload throughput results are monitored and recorded. Monitoring may include counting memory transactions on memory bus 510, receiving throughput information from a processor, monitoring the status of transaction queue 504, a command scheduler 530, or a cache. Throughput may again be recorded in the memory controller 502.

The process moves to decision 420. At step 420, the two recorded workload throughput measurements of steps 412 and 416 are compared, and one of the first and second DRAM refresh timings is chosen as that which corresponds to the greater recorded throughput measurements. If the first DRAM refresh timing corresponds to the greater workload throughput measurement, the process moves to step 422. If the second DRAM refresh timing corresponds to the greater workload throughput measurement, the process moves to step 418.

Both steps 418 and 422 involve running the workload for a predetermined time period. The predetermined time period of steps 418 and 422 may be different in one embodiment, and the identical in another. In second and following executions of steps 418 and 422, one or both of these steps may include replacing the first or second refresh timing with an additional refresh timing.

The predetermined time period of steps 418 and 422 may be much longer than the first or second number of refresh intervals of steps 410 and 414, and may also correspond to expected phase behavior of the particular workload being run. After the predetermined time period of steps 418 and 422 had expired, the process returns to step 410 to repeat steps 410, 412, 414, 416, 420, and one of 418 and 422. The repetition of steps described continues until the memory system is no longer active.

FIG. 5 is a block diagram representation of a memory controller 502, adapted to adjust DRAM refresh timing, according to embodiments of the invention. The memory controller 502 is comprised of a transaction queue 504, a command scheduler 530, a refresh mode controller 532, a memory performance measurement unit 534, a command bus 524, a memory bus 510, and a processor command bus 528.

The memory controller 502 is coupled to a processor 526 through the processor command bus 528, and to a memory 512, through the memory bus 510. The processor 526 includes a throughput monitor 527. The memory 512 includes one or more memory ranks 518. The function of the memory performance measurement unit (MPMU) 534 is to receive and measure workload throughput information from multiple sources. The MPMU 534 is coupled to the memory bus 510, the transaction queue 504 the command scheduler 530, and the throughput monitor 527. The MPMU 534 may receive processor core status, cache status, the number of memory commands dispatched, or performance measurement information from throughput monitor 527, and memory bus activity (number of commands dispatched within a time window) information from memory bus 510. The MPMU 534 may also receive transaction queue status (e.g., transaction queue full or not, how long a time it was full, is transaction queue occupied over some threshold, average number of commands in the queue) from the transaction queue 504, and status (e.g., number of rejected commands due to command queue full, tRFC timer status) from the command scheduler 530.

The MPMU 534 aggregates the above-listed workload throughput information, and sends it to the refresh mode controller 532. The functions of the refresh mode controller (RMC) 532 are to receive performance input from MPMU 534, store workload throughput history, tRFC and tREFI (in register values 536), and makes decisions based on workload throughput history on which refresh setting will yield the highest workload throughput. Once RMC 532 decides on an appropriate refresh setting (1×, 2×, or 4× for DDR4), it sends this information to the command scheduler 530. The RMC 532 is coupled to the MPMU 534 and the command scheduler 530. The RMC 532 keeps no long-term throughput history; it performs only short term tracking of workload throughput information.

A function of the transaction queue(s) 504 is to provide a staging area for commands (read, write, and refresh) to be issued in order to the memory 512. For simplicity of illustration only one transaction queue is shown in FIG. 5, however, a memory system may have separate and/or multiple read, write, and refresh transaction queues, based on the number of ranks, or channels in the memory system.

The command scheduler 530 may make use of low priority command path 520, medium priority command path 514, and high priority command path 522 in conjunction with the command bus 524 in order to place commands in the appropriate relative location (priority) within the transaction queue 504. Commands flow from left to right in figure as they are dispatched to memory 512; commands on the far right in the figure are the next to be sent to memory. The transaction queue 504 may receive (3) types of commands from the command scheduler 530: read, write and refresh. Exemplary write commands 506, read commands 508, and refresh transactions 516 are shown.

The function of the command scheduler 530 is to receive refresh mode information from the refresh mode controller 532, and memory requests from the processor 526, and to generate and appropriately place and arrange read, write, and refresh commands within the transaction queue 504. The command scheduler 530 may place generated commands in priority positions in the transaction queue 504 based on a set of rules; for example write commands may have a low priority, read commands may have a medium priority, and refresh commands may have a high priority.

The command scheduler 530 may also keeps track of refresh operation timing through an internal timer function, and DRAM cell retention time (tRET) information. The overall function of memory controller 502 is to monitor workload throughput over a number of DRAM refresh settings, and dynamically chose and implement the DRAM refresh setting that will provide the highest workload throughput.

Although the present invention has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the invention.

What is claimed is:

1. A memory controller to monitor and manage the throughput of a dynamic application workload running on a dynamic random-access memory (DRAM) system by periodically adjusting a DRAM refresh timing granularity that includes the duration of a DRAM refresh interval, the memory controller comprising:

a refresh mode controller (RMC) electrically coupled to a memory performance measurement unit (MPMU) and to the command scheduler, the RMC having registers to hold DRAM refresh mode information including a duration of a DRAM refresh interval, the RMC further having circuits to receive aggregated dynamic application workload throughput information sent from the MPMU, and to, in response, select and send, to a command scheduler, DRAM refresh mode information corresponding to a highest throughput measurement from the aggregated throughput information;

the MPMU, electrically coupled to receive dynamic application workload throughput information from each of a command scheduler, a transaction queue and a memory bus, the MPMU having circuits to make, during the execution of a dynamic application workload, dynamic application workload throughput measurements based upon a received dynamic application workload throughput information and to combine the measurements into aggregated dynamic application workload throughput information; and a command scheduler, electrically coupled to the RMC and to the transaction queue, the command scheduler having circuits to receive refresh mode information from the RMC, and to generate and place memory commands within the transaction queue.

2. The memory controller of claim 1, wherein the command scheduler further includes circuits configured to, in response to the DRAM refresh mode information received from the RMC, control the transaction queue by generating, inserting and re-ordering memory refresh commands within the transaction queue.

3. The memory controller of claim 1, wherein the MPMU further includes circuits configured to monitor at least one indicator of a group consisting of: a number of commands dispatched to memory devices within a first time period and a number of commands received from a processor coupled to the command scheduler, within a second time period.

4. The memory controller of claim 1, wherein the MPMU further includes circuits configured to monitor status of the transaction queue, including at least one indicator of a group consisting of: a number of commands in the transaction queue, a time-based history of the number of commands in the transaction queue, and an average number of commands in the transaction queue.

5. The memory controller of claim 1, wherein the MPMU further includes circuits configured to monitor at least one command scheduler status indicator of a group consisting of: a count of commands rejected in response to a full command queue and a time needed to complete each refresh operation.

6. The memory controller of claim 1, wherein the MPMU further includes circuits configured to monitor a "request queue full" status of a cache.

7. The memory controller of claim 1, wherein the MPMU further includes circuits configured to receive and monitor at least one status indicator of a group consisting of: a processor core status and a measured processor throughput.

8. The memory controller of claim 1, wherein the RMC further includes circuits configured to run the dynamic application workload for a predetermined period of time using a selected DRAM refresh timing granularity.

9. The memory controller of claim 1, wherein the RMC further includes circuits configured to determine a longest selectable DRAM refresh interval between a start of a first refresh command and a start of a next refresh command issued to a DRAM memory device.

10. The memory controller of claim 1, wherein the RMC further includes circuits configured to select a DRAM refresh timing granularity that includes a time period between a start of a first DRAM refresh command and a start of a next DRAM refresh command, the DRAM refresh timing granularity further including an amount of time consumed by each refresh operation.

11. The memory controller of claim 7, wherein the RMC further includes circuits configured to store one or more of the dynamic application workload throughput measurements within a memory controller.

\* \* \* \* \*